US005751177A

United States Patent [19]

Tanoi

[11] Patent Number: 5,751,177

[45] Date of Patent: May 12, 1998

[54] VARIABLE LEVEL SHIFTER AND MULTIPLIER SUITABLE FOR LOW-VOLTAGE DIFFERENTIAL OPERATION

[75] Inventor: Satoru Tanoi, Tokyo, Japan

[73] Assignee: Oki Electric Industry Co., Ltd., Tokyo, Japan

[21] Appl. No.: 661,922

[22] Filed: Jun. 11, 1996

[30] Foreign Application Priority Data

Jul. 3, 1995 [JP] Japan ........................... 7-167435

[51] Int. Cl.[6] .............................. H03F 3/45

[52] U.S. Cl. .................... 327/333; 327/65; 327/563; 327/355; 327/359

[58] Field of Search .................... 327/103, 333, 327/560, 561, 562, 355, 356, 357, 359, 65, 563, 113

[56] References Cited

U.S. PATENT DOCUMENTS

| | | | |
|---|---|---|---|
| 5,396,131 | 3/1995 | Miki et al. | 327/563 |
| 5,438,296 | 8/1995 | Kimura | 327/563 |
| 5,504,442 | 4/1996 | Tanoi | 327/51 |

FOREIGN PATENT DOCUMENTS

| | | |
|---|---|---|
| 0 603 829 A | 6/1994 | European Pat. Off. . |
| 2 272 090 | 5/1994 | United Kingdom . |

OTHER PUBLICATIONS

A.B. Grebene, Bipolar and MOS Analog Integrated Circuit Design, John Wiley, 1983, pp. 274–276, 278–280 and 456–459.

Z. Wang, "Novel Linearisation Technique for Implementing Large–Signal MOS Tunable Transconductor," Electronics Letters, vol. 26, No. 2, 18th Jan. 1990, pp. 138–139.

Singh, S.P. et al: "High Frequency Analog Signal Processing Circuits Based on a CMOS Transconductor", 12 Aug. 1990, Proceedings of the Midwest Symposium on Circuits and Systems, Calgary, Aug. 12–15, 1990, vol. 1, Nr. Conf. 33 pp. 261–264. XP000295111.

*Primary Examiner*—Timothy P. Callahan
*Assistant Examiner*—Dinh Le

[57] ABSTRACT

A variable level shifter has a first transconductor cell receiving a first pair of voltages, and second and third transconductor cells both receiving a second pair of voltages. The transconductor cells are differential voltage-to-current amplifiers employing field-effect transistors. The two current outputs of the first transconductor cell are coupled to respective output terminals. One current output of the second transconductor cell is coupled to one of these output terminals, and the corresponding current output of the third transconductor cell is coupled to the other output terminal. A fourth transconductor cell may be added to obtain two pairs of outputs shifted in opposite directions. A differential multiplier can be constructed using this four-cell variable level shifter and additional field-effect transistors.

6 Claims, 6 Drawing Sheets

VARIABLE LEVEL SHIFTER AND MULTIPLIER SUITABLE FOR LOW-VOLTAGE DIFFERENTIAL OPERATION

BACKGROUND OF THE INVENTION

The present invention relates to a variable level shifter in which the size of the level shift can be controlled by a differential voltage input, and to a multiplier employing this type of variable level shifter.

Referring to attached FIG. 6, a conventional variable level shifter employs a pair of n-channel metal-oxide-semiconductor (NMOS) transistors N21 and N22 coupled in series between a power-supply node (Vcc) and ground, with an output terminal O coupled to a node between the two transistors. Transistor N22 operates as a current source, the current flow being regulated by the voltage input to gate terminal G22. Transistor N21 operates as a source follower, the gate-source voltage between gate terminal G21 and output terminal O varying with the current flow. The voltage level applied to terminal G21 is thereby shifted down by an amount controlled by the voltage applied to terminal G22.

Referring to FIG. 7, a conventional differential analog multiplier comprises a current source IS3 coupled to ground, a pair of NMOS transistors N31 and N32 having their source terminals coupled to current source IS3, another pair of NMOS transistors N33 and N34 having their source terminals coupled to the drain terminal of transistor N31, a further pair of NMOS transistors N35 and N36 having their source terminals coupled to the drain terminal of transistor N32, a resistor R3 coupled between Vcc and the drain terminals of transistors N33 and N35, and a resistor R3*b* coupled between Vcc and the drain terminals of transistors N34 and N36. The gates of transistors N31 and N32 are coupled to respective voltage input terminals IA and IAb. The gates of transistors N33 and N36 are coupled to a voltage input terminal IB, and the gates of transistors N34 and N35 to a voltage input terminal IBb. Output terminals O and Ob are coupled to nodes disposed between resistors R3 and R3*b* and the other circuit elements. The output voltage difference between terminals O and Ob is proportional to the product of the input voltage difference between terminals IA and IAb and the input voltage difference between terminals IB and IBb.

The conventional level shifter in FIG. 6 has a single-ended voltage input signal, and is unsuitable for use in circuits employing differential voltage signals. Applications of this level shifter are further limited by the requirement that the voltage input at gate terminal G21 be comparatively high and the voltage input at gate terminal G22 be comparatively low, in order for both transistors N21 and N22 to saturate. The input voltage at gate terminal G21, in particular, must exceed the output voltage at terminal O by an amount not less than the threshold voltage of transistor N21. These requirements limit the dynamic range of the level shifter in FIG. 6, the limitation being particularly severe in low-voltage circuits (circuits with a small value of Vcc).

A further problem with the conventional level shifter in FIG. 6 is poor linearity, because the source-drain voltages of both transistors N21 and N22 vary depending on the output voltage at terminal O.

A problem in the conventional multiplier shown in FIG. 7 is that, counting the current source IS3, there are three transistor stages between Vcc and ground. The dynamic range of the output voltages is thus limited by the voltage drop across three transistors, the limitation being particularly severe in low-voltage circuit applications. Another problem is asymmetric electrical characteristics: the gain and frequency characteristics of the first pair of differential voltage input terminals IA and IAb, which are coupled to transistors N31 and N32 in the second stage, inconveniently differ from those of the second pair of differential voltage input terminals IB and IBb, which are coupled to transistors N33, N34, N35, and N36 in the third stage.

SUMMARY OF THE INVENTION

It is accordingly an object of the present invention to provide a level shifter that accepts differential input signals.

An additional object is to provide a variable level shifter with a wide dynamic range.

Another object is to provide a variable level shifter with symmetrical electrical characteristics.

Still another object is to provide a variable level shifter suitable for low-voltage operation.

Yet another object is to provide a variable level shifter with good linearity.

A further object is to provide a differential multiplier with symmetrical electrical characteristics.

A still further object is to provide a differential multiplier suitable for low-voltage operation.

A yet further object is to provide a differential multiplier with good linearity.

According to a first aspect of the invention, a variable level shifter has a first pair of voltage input terminals, a second pair of voltage input terminals, and three transconductor cells. Each transconductor cell employs field-effect transistors to amplify a pair of input voltages and produce a pair of drain currents, the difference between the drain currents corresponding to the difference between the input voltages. The first transconductor cell receives input voltages from the first pair of voltage input terminals. The second and third transconductor cells receive input voltages from the second pair of voltage input terminals. One drain current produced by the first transconductor cell and one drain current produced by the second transconductance cell are coupled to a first output terminal. The other drain current produced by the first transconductor cell and one drain current produced by the third transconductance cell are coupled to a second output terminal. The difference between the currents coupled to the first output terminal and the currents coupled to the second output terminal corresponds to the voltage difference at the first pair of voltage input terminals, while the sum of the currents is shifted up or down by an amount corresponding to the voltage difference at the second pair of voltage input terminals.

According to a second aspect of the invention, a variable level shifter is structured as in the first aspect of the invention, but has four transconductor cells, and has third and fourth output terminals. One drain current produced by the fourth transconductor cell and the other drain current produced by the second transconductance cell are coupled to the third output terminal. The other drain current produced by the fourth transconductor cell and the other drain current produced by the third transconductance cell are coupled to a fourth output terminal. The sum and difference of the currents coupled to the third and fourth output terminals are similar to the sum and difference of the currents coupled to the first and second output terminals, except that the sum is shifted in the opposite direction.

According to a third aspect of the invention, a differential multiplier comprises the variable level shifter of the second aspect of the invention, or an equivalent variable level shifter, with current-voltage conversion means for converting the four output currents to output voltages. The differential multiplier also comprises four field-effect transistors with gate terminals coupled to respective output terminals of the variable level shifter, and a pair of constant-current sources. The source terminals of the first and second field-effect transistors are coupled to the first constant-current source; the source terminals of the second two field-effect transistors are coupled to the second constant-current source. The drain terminals of the transistors are cross-coupled, the drain terminals of the first and fourth field-effect transistors being coupled to one multiplier output terminal, and the drain terminals of the second and third field-effect transistors being coupled to another multiplier output terminal. The difference between the currents coupled to the first multiplier output terminal and the currents coupled to the second multiplier output terminal corresponds to the product of the difference between the voltages at the first pair of voltage input terminals of the variable level shifter, and the difference between the voltages at the second pair of voltage input terminals of the variable level shifter.

DETAILED DESCRIPTION OF THE PREFERRED EMBODIMENTS

Embodiments of the invention will be described with reference to the attached illustrative drawings.

First variable level shifter

Figure 1:
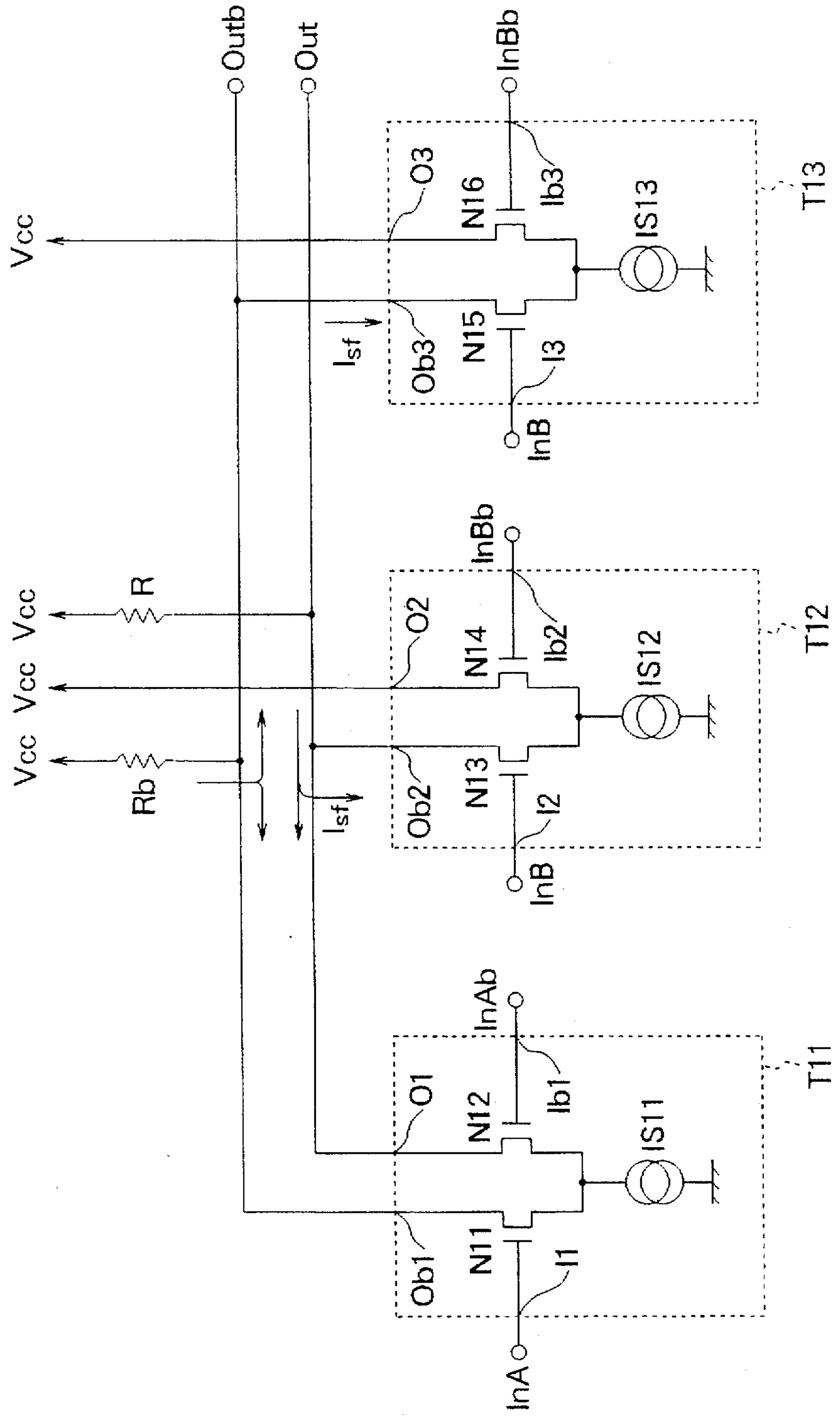
FIG. 1 is a circuit diagram illustrating a novel variable level shifter.

Referring to FIG. 1, a first novel variable level shifter has a first pair of differential voltage input terminals InA and InAb, a second pair of differential voltage input terminals InB and InBb, and a pair of differential voltage output terminals Out and Outb. As the following description will show, the level shifter is structured so that the voltage levels input at the first pair of input terminals InA and InAb are differentially amplified and are both shifted up, or both shifted down, by an amount determined by the voltage difference at the second pair of input terminals InB and InBb.

The variable level shifter comprises three transconductor cells T11, T12, and T13 having respective constant-current sources IS11, IS12, and IS13, and respective pairs of NMOS transistors N11 and N12, N13 and N14, or N15 and N16. Each transconductor cell has two input terminals (I1 and Ib1, I2 and Ib2, and I3 and Ib3), and two output terminals (O1 and Ob1, O2 and Ob2, and O3 and Ob3). The source terminals of both NMOS transistors in each transconductor cell are coupled to the current source in the same transconductor cell. NMOS transistors N11, N13, and N15 have their gate terminals coupled to the I input terminal (I1, I2, or I3) of the corresponding transconductor cell, and their drain terminals coupled to the Ob output terminal (Ob1, Ob2, or Ob3). NMOS transistors N12, N14, and N16 have their gate terminals coupled to the Ib input terminal (Ib1, Ib2, or Ib3), and their drain terminals coupled to the O output terminal (O1, O2, or O3).

It is necessary for the second and third transconductor cells T12 and T13 to have the same electrical characteristics, and preferable in many applications for all three transconductance cells to have the same characteristics. In the following description it will be assumed that the electrical characteristics of the three transconductor cells are identical.

The three transconductor cells T11, T12, and T13 are connected as follows.

Input terminal I1 of transconductor cell T11 is coupled to input terminal InA, while input terminal Ib1 of transconductor cell T11 is coupled to input terminal InAb. Input terminals I2 and I3 of transconductor cells T12 and T13 are both coupled to input terminal InB, while input terminals Ib2 and Ib3 of these cells T12 and T13 are both coupled to input terminal InBb. Output terminal O1 of transconductor cell T11 and output terminal Ob2 of transconductor cell T12 are both coupled to output terminal Out, and to one end of a load resistor R. The other end of load resistor R is coupled to a supply voltage node. Output terminal Ob1 of transconductor cell T11 and output terminal Ob3 of transconductor cell T13 are both coupled to output terminal Outb and to one end of another load resistor Rb. The other end of load resistor Rb is coupled to another supply voltage node. Output terminals O2 and O3 of transconductor cells T12 and T13 are coupled to further supply voltage terminals. All supply voltage nodes are held at the same potential (Vcc).

The load resistors R and Rb are, for example, diffused resistors, unsaturated p-channel metal-oxide-semiconductor (PMOS) transistors, or NMOS transistors with their gates coupled to their drains. The two load resistors R and Rb have equal resistance values.

Next the operation of the variable level shifter in FIG. 1 will be described, with reference to FIGS. 2 and 3.

In these drawings, the voltage signals received at input terminals InA, InAb, InB, and InBb are denoted $V_A$, $V_{Ab}$, $V_B$, and $V_{Bb}$, respectively. The horizontal axes in both FIGS. 2 and 3 indicate the differential input ($V_A-V_{Ab}$) at input terminals InA and InAb. The vertical axis in FIG. 2 indicates the output voltage Vout at output terminal Out. The vertical axis in FIG. 3 indicates the output voltage Voutb at output terminal Outb. Both drawings show input-output characteristics for three values of the differential input ($V_B-V_{Bb}$) at input terminals InB and InBb.

In the following description, the drain current of NMOS transistor N11 will be denoted $I_{1b}$, and the drain current of NMOS transistor N12 will be denoted $I_1$. The sum of these two currents, which is equal to the constant current from current source IS11, will be denoted $2.I_0$. Transconductance cells 12 and 13 both receive the same inputs $V_B$ and $V_{Bb}$, so the drain currents of NMOS transistors N13 and N15 are equal, and will both be denoted $I_{sf}$. The value of $I_{sf}$ depends only on input signals $V_B$ and $V_{Bb}$.

The output voltages Vout and Voutb can be expressed by equations (1, 1) and (1, 2), in which r is the resistance value of the load resistors R and Rb.

$$Voutb=Vcc-r(I_{1b}+I_{sf}) \quad (1, 1)$$

$$Vout=Vcc-r(I_1+I_{sf}) \quad (1, 2)$$

First, the circuit operation when $V_B$ and $V_{Bb}$ are held constant and $V_A$ and $V_{Ab}$ are allowed to vary will be described.

When the first input voltages $V_A$ and $V_{Ab}$ are equal, the drain currents $I_{1b}$ and $I_1$ of NMOS transistors N11 and N12 are both equal to $I_0$. The resulting output voltages Vout and Voutb at output terminals Out and Outb are therefore equal to the same quantity $V_0$.

$$Vout=Voutb=Vcc-rI_{sf}-rI_0=V_0$$

If the input voltages $V_A$ and $V_{Ab}$ are altered from this equal state, the drain currents $I_{1b}$ and $I_1$ of NMOS transistors N12 change in proportion to the potential difference $V_A-V_{Ab}$, due to the differential amplifying action of transconductor cell T11. The drain currents $I_{1b}$ and $I_1$ can be expressed by equations (1, 3) and (1, 4), in which $\alpha$ is a constant amplification factor. Combined with equations (1, 1) and (1, 2), these equations yield equations (1, 5) and (1, 6).

$$I_{1b}=I_0[1-\alpha(V_A-V_{Ab})] \quad (1, 3)$$

$$I_1=I_0[1+\alpha(V_A-V_{Ab})] \quad (1, 4)$$

$$Voutb=Vcc-rI_{sf}-rI_0[1+\alpha(V_A-V_{Ab})] \quad (1, 5)$$

$$Vout=Vcc-rI_{sf}-rI_0[1-\alpha(V_A-V_{Ab})] \quad (1, 6)$$

These equations show that for any given pair of inputs $V_B$ and $V_{Bb}$ at the second pair of input terminals InB and InBb, as the voltage difference $V_A-V_{Ab}$ at the first pair of input terminals InA and InAb increases, Vout will increase linearly, and VoutB will decrease linearly. Similarly, if $V_A-V_{Ab}$ decreases, Vout will decrease linearly, and Voutb will increase linearly. The constant of linearity ($r\ \alpha I_0$) is independent of $I_{sf}$. If $k_0$ denotes this constant of linearity, then equations (1, 5) and (1, 6) can be simplified as follows:

$$Voutb=V_0-k_0(V_A-V_{Ab}) \quad (1, 7)$$

$$Vout=V_0+k_0(V_A-V_{Ab}) \quad (1, 8)$$

Within the linear range of the level shifter, therefore, a differential output voltage Vout–Voutb equal to $2k_0(V_A-V_{Ab})$ is obtained.

Next, the operation when $V_A$ and $V_{Ab}$ are held constant and $V_B$ and $V_{Bb}$ are allowed to vary will be described.

Let $I_{sf0}$ denote the drain current of NMOS transistors N13 and N15 when $V_B$ and $V_{Bb}$ and equal. If the second differential input voltage increases so that $V_B-V_{Bb}>0$, the drain currents $I_{sf}$ of NMOS transistors N13 and N15 increase by an amount $\Delta I_{sf}$ proportional to $|V_B-V_{Bb}|$, the absolute value of the second differential input voltage, as in equation (1, 9).

$$I_{sf}=I_{sf}0+\Delta I_{sf} \quad (1, 9)$$

If this current $I_{sf}$ is substituted into equations (1, 5) and (1, 6), and if the symbol $\Delta Vs$ is used to denote $r\Delta I_{sf}$, then equations (1, 10) and (1, 11) are obtained. Equations (1, 10) and (1, 11) show that the output voltages Vout and Voutb both decrease by $\Delta Vs$ in comparison with the case when $V_B$ and $V_{Bb}$ are equal.

$$\begin{aligned} Voutb &= Vcc - r(I_{sf0}+\Delta I_{sf}) - rI_0[1+\alpha(V_A-V_{Ab})] \quad (1, 10) \\ &= V_0 - k_0(V_A-V_{Ab}) - \Delta Vs \end{aligned}$$

$$\begin{aligned} Vout &= Vcc - r(I_{sf0}+\Delta I_{sf}) - rI_0[1+\alpha(V_A-V_{Ab})] \quad (1, 11) \\ &= V_0 + k_0(V_A-V_{Ab}) - \Delta Vs \end{aligned}$$

Similarly, if the second differential input voltage decreases so that $V_B-V_{Bb}<0$, the current $I_{sf}$ flowing to transconductor cells T12 and T13 decreases as shown in equation (1, 12). The current decrease $\Delta I_{sf}$ is again proportional to $|V_B-V_{Bb}|$.

$$I_{sf}=I_{sf0}-\Delta I_{sf} \quad (1, 12)$$

If this current $I_{sf}$ is substituted into equations (1, 5) and (1, 6), after rearrangement, equations (1, 13) and (1, 14) are obtained, with $\Delta Vs$ again denoting $r\Delta I_{sf}$. These equations show that the output voltages Vout and Voutb both rise by $\Delta Vs$ in comparison with the case when $V_B$ and $V_{Bb}$ are equal.

$$\begin{aligned} Voutb &= Vcc - r(I_{sf0}-\Delta I_{sf}) - rI_0[1+\alpha(V_A-V_{Ab})] \quad (1, 13) \\ &= V_0 - k_0(V_A-V_{Ab}) + \Delta Vs \end{aligned}$$

$$\begin{aligned} Vout &= Vcc - r(I_{sf0}-\Delta I_{sf}) - rI_0[1-\alpha(V_A-V_{Ab})] \quad (1, 14) \\ &= V_0 + k_0(V_A-V_{Ab}) + \Delta Vs \end{aligned}$$

The voltage shift $\Delta Vs$ is equal to $r\Delta I_{sf}$ and the current shift $\Delta I_{sf}$ is proportional to $|V_B-V_{Bb}|$, so the voltage shift $\Delta Vs$ is proportional to $|V_B-V_{Bb}|$. The constant of proportionality can be denoted $k_1$ to obtain the following equations (1, 15) and (1, 16).

$$Voutb=V_0-k_0(V_A-V_{Ab})-k_1(V_B-V_{Bb}) \quad (1, 15)$$

$$Vout=V_0+k_0(V_A-V_{Ab})-k_1(V_B-V_{Bb}) \quad (1, 16)$$

Figure 2:
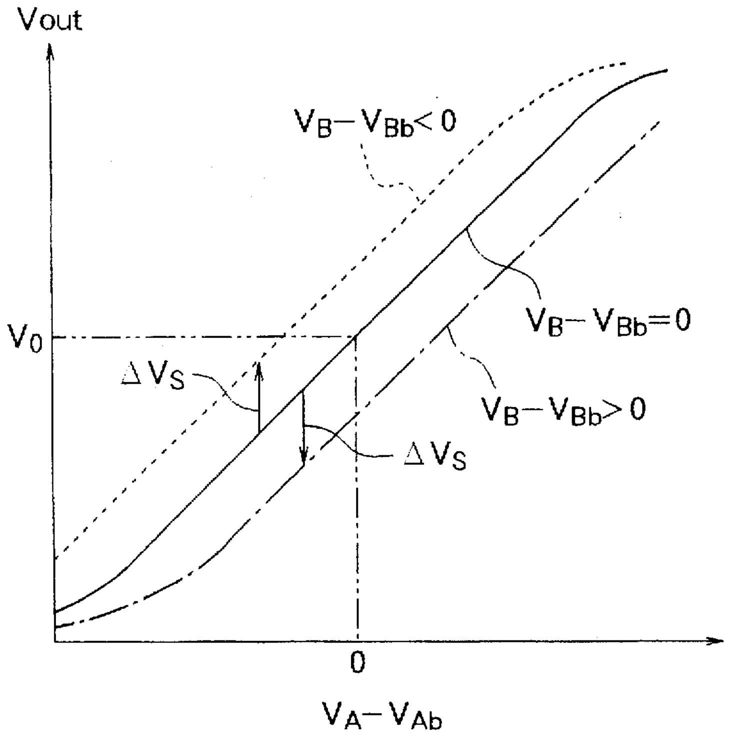
FIG. 2 is a diagram of input-output characteristics for one output terminal of the variable level shifter in FIG. 1.
Figure 3:
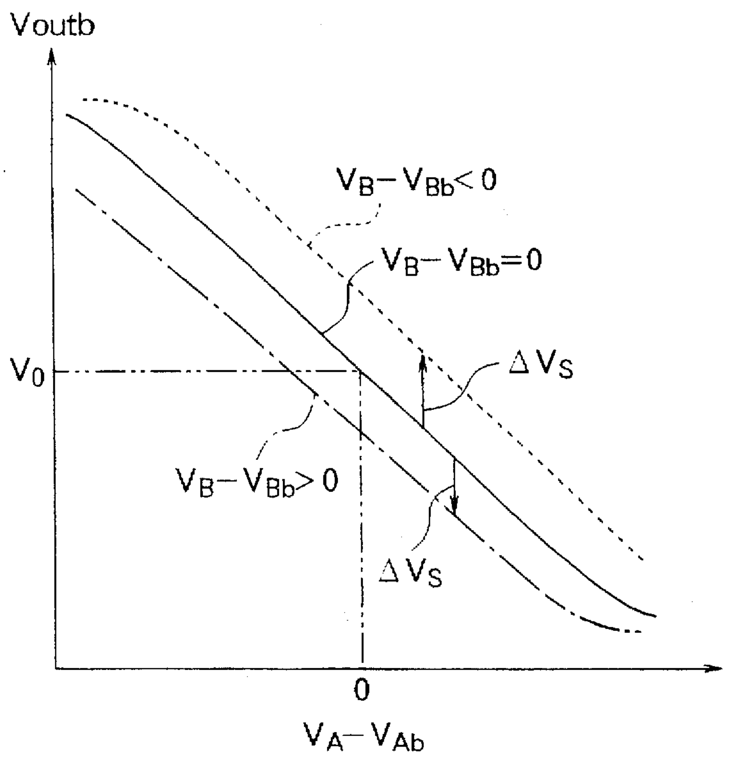
FIG. 3 is a diagram of input-output characteristics for the other output terminal of the variable level shifter in FIG. 1.

These input-output relations are indicated in FIGS. 2 and 3 by solid lines for the case in which $V_B-V_{Bb}=0$, by dash-dot lines for the case in which $V_B-V_{Bb}>0$, and by dotted lines for the case in which $V_B-V_{Bb}<0$. The differential output voltage (Vout–Voutb) is proportional to the first differential input voltage ($V_A-V_{Ab}$), and both output voltages Vout and Voutb shift up or down by an amount proportional to the second differential voltage ($V_B-V_{Bb}$). More precisely, the common-mode or mean value of the two output voltages Vout and Voutb shifts in proportion to $V_B-V_{Bb}$. Equivalently, the sum of Vout and Voutb shifts in proportion to $V_B-V_{Bb}$. Thus a voltage-controlled variable level shifter is obtained that can output a differential voltage output signal with a differential swing substantially proportional to a first differential voltage input and a level that shifts in proportion to a second differential voltage input.

The values of $k_0$ and $k_1$ can be made equal by coupling load resistors (not visible) with the above-mentioned resistance value r between output terminals O2 and O3 of transconductor cells T12 and T13 and Vcc.

One feature of this variable level shifter is the symmetry of its electrical characteristics. If all three transconductance cells have the same electrical characteristics, and if $k_0$ equals $k_1$, then the level shifter has similar gain and frequency responses at both pairs of input terminals. Moreover, the biasing requirements for both pairs of input terminals are identical. Referring again to FIG. 1, the first pair of input terminals (InA and InAb) and the second pair of input terminals (InB and InBb) are both coupled to transistors in the same stage, as viewed from the output terminals and from ground, so there is no need to bias one pair of inputs to a different level from the other pair.

Another feature is that the direction and size of the level shift are not limited by transistor threshold voltages. The level shift may be either positive or negative, depending on the polarity of the second differential input voltage $V_B-V_{Bb}$, and a satisfactory range of level shifts can be obtained even in low-voltage operation.

Still another feature of this variable level shifter is that excellent linearity can be obtained by using high-impedance current sources (IS11, IS12, and IS13), as in differential amplifying circuits in general.

Second variable level shifter

Figure 4:
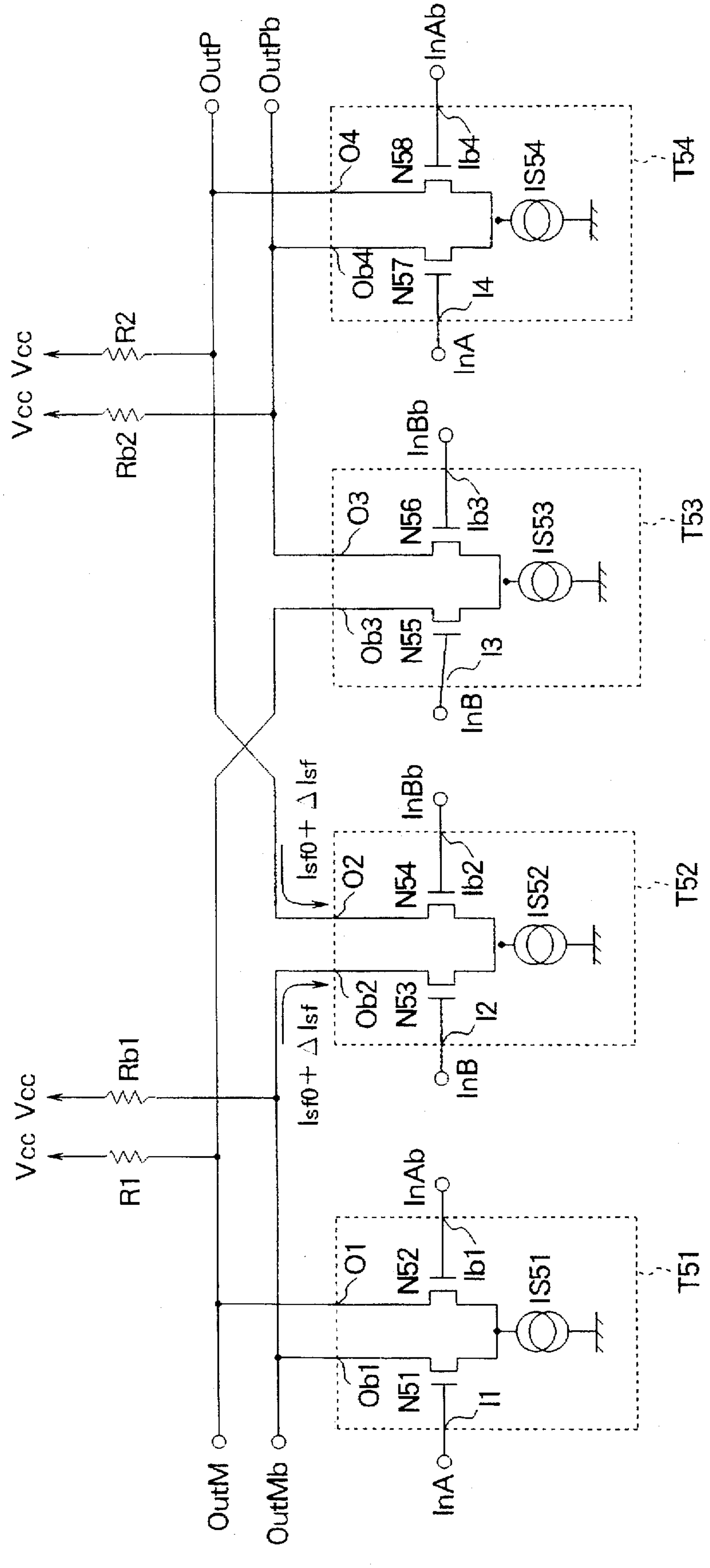
FIG. 4 is a circuit diagram illustrating another novel variable level shifter.

Referring to FIG. 4 a second novel variable level shifter has the same input terminals InA, InAb, InB, and InBb as the first variable level shifter, but has two pairs of differential output terminals. Outputs OutM and OutMb respond to the input voltage signals $V_A$, $V_{Ab}$, $V_B$, and $V_{Bb}$ in the same way as outputs Out and Outb in the first variable level shifter, shifting up when the second differential input voltage $V_B-V_{Bb}$ is negative, and shifting down when $V_B-V_{Bb}$ is positive. Outputs OutP and OutPb also respond in the same way, but shift up when $V_B-V_{Bb}$ is positive, and down when $V_B-V_{Bb}$ is negative.

Pairs of output signals shifted in different directions could be obtained from two variable level shifters with configurations similar to FIG. 1, one level shifter being modified to provide an upward shift instead of a downward shift, but that scheme would require a total of six transconductor cells. The variable level shifter in FIG. 4 requires only four transconductor cells.

Each of the four transconductor cells T51, T52, T53, and T54 in FIG. 4 has the same internal configuration as the transconductor cells in FIG. 1. Their input and output terminals are identified by the same symbols as in FIG. 1, using I4, Ib4, O4, and Ob4 for the fourth transconductor cell T54. The constant-current sources in the four cells are denoted IS51, IS52, IS53, and IS54. The NMOS transistors are denoted N51, N52, N53, N54, N55, N56, N57, and N58.

Input terminals I1 and I4 of transconductor cells T51 and T54 are coupled to input terminal InA of the variable level shifter, while input terminals Ib1 and Ib4 of these transconductor cells T51 and T54 are coupled to input terminal InAb. Input terminals I2 and I3 of transconductor cells T52 and T53 are coupled to input terminal InB of the variable level shifter, while input terminals Ib2 and Ib3 of these transconductor cells T52 and T53 are coupled to input terminal InBb.

Output terminal O1 of transconductor cell T51, output terminal Ob3 of transconductor cell T53, and one end of a load resistor R1 are coupled to output terminal OutM. Output terminal Ob1 of transconductor cell T51, output terminal Ob2 of transconductor cell T52, and one end of a load resistor Rb1 are coupled to output terminal OutMb. Output terminal O4 of transconductor cell T54, output terminal O2 of transconductor cell T52, and one end of a load resistor R2 are coupled to output terminal OutP. Output terminal Ob4 of transconductor cell T54, output terminal O3 of transconductor cell T53, and one end of a load resistor Rb2 are coupled to output terminal OutPb.

The four load resistors R1, R1b, R2, and R2b have equal resistance values. The electrical characteristics of transconductor cells T51 and T54 should be mutually identical, and the electrical characteristics of transconductor cells T52 and T54 should be mutually identical. It will be assumed below that all four cells have the same electrical characteristics.

The symbol $I_{sf0}$ in FIG. 4 denotes the equal drain currents of transistors N53, N54, N55, and N56 when the voltages $V_B$ and $V_{Bb}$ applied to input terminals InB and InBb are equal. If these inputs change so that $V_B-V_{Bb}\geqq 0$, then the drain currents of transistors N53 and N55 increase by an amount $\Delta I_{sf}$ proportional to $V_B-V_{Bb}$, while the drain currents of transistors N54 and N56 decrease by the same amount $\Delta I_{sf}$.

Regarding the voltages at output terminals OutM and OutMb, a comparison of FIGS. 1 and 4 shows that these output terminals and transconductor cells T51, T52, and T53 in FIG. 4 are connected in the same way as output terminals Out and Outb and transconductor cells T11, T12, and T13 in FIG. 1. The connections of transconductor cells T51, T52, and T53 to input terminals InA, InAb, InB, and InBb in FIG. 4 are also the same as the connections of transconductor cells T11, T12, and T13 in FIG. 1. The only difference is the presence of resistors R2 and Rb2 between Vcc and the drains of transistors N54 and N56. The presence of these resistors R2 and Rb2 may affect the size of the voltage shift due to the $V_B-V_{Bb}$ voltage difference, but the basic operation of the circuit does not change. The voltage difference between output terminals OutM and OutMb is proportional to the voltage difference between input terminals InA and InAb, and the sum of the voltages at output terminals OutM and OutMb is shifted down in proportion to the voltage difference between input terminals InB and InBb.

Regarding the voltages at output terminals OutP and OutPb, a comparison of FIGS. 1 and 4 shows that these output terminals, the input terminals, and transconductor cells T54, T52, and T53 in FIG. 4 are connected in the same way as output terminals Out and Outb, the input terminals, and transconductor cells T11, T12, and T13 in FIG. 1, except for two differences. One difference is the presence of resistors R1 and Rb1. The other difference is that the roles of input terminals InB and InBb are interchanged.

The first difference does not alter the basic circuit operation, but because of the second difference, the shift of the voltages at output terminals OutP and OutPb is upward when $V_B-V_{Bb}$ is positive, and downward when $V_B-V_{Bb}$ is negative. The voltage difference between output terminals OutP and OutPb is still proportional to the voltage difference between input terminals InA and InAb.

The variable level shifter in FIG. 4 thus shifts the pair of input voltages at input terminals InA and InAb both upward and downward simultaneously to obtain two pairs of output voltages, both having the same voltage difference. The differential output voltage is proportional to the differential input voltage $V_A-V_{Ab}$. The size of the shift is proportional to the differential input voltage $V_B-V_{Bb}$.

The input-output characteristics of the circuit in FIG. 4 can be expected to show even better linearity than the input-output characteristics of the circuit in FIG. 1, because the output terminals of transconductor cells T52 and T53 are connected to mutually symmetric circuits.

Multiplier

Figure 6:
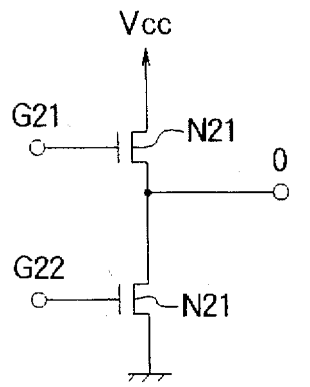
FIG. 6 is a circuit diagram illustrating a conventional variable level shifter.
Figure 7:
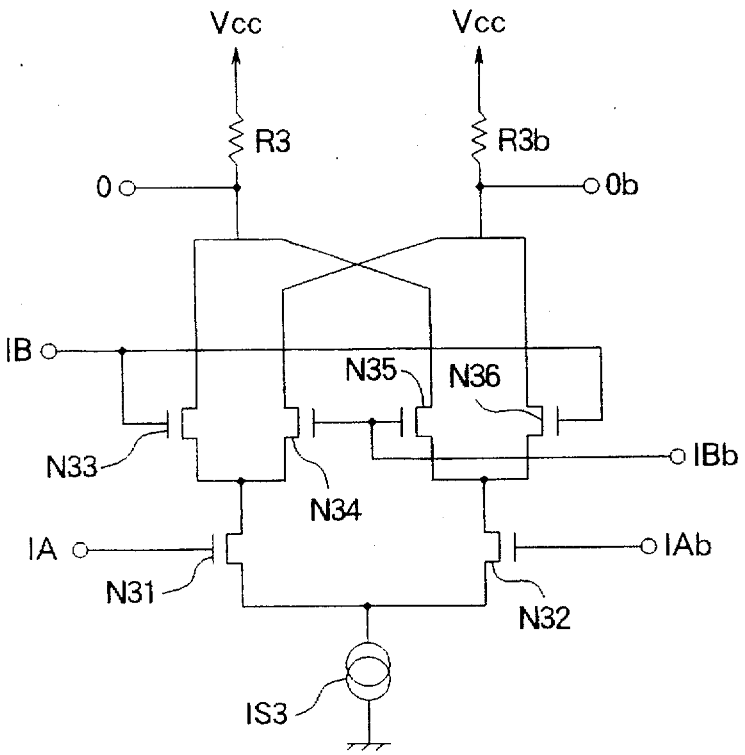
FIG. 7 is a circuit diagram illustrating a conventional differential multiplier.

Referring to FIG. 6, a novel differential multiplier comprises a variable level shifter 60 and a multiplying circuit 61. This multiplier produces a voltage difference at output terminals Out and Outb that is proportional to the product of the voltage difference ΔA between input terminals INA and INAb and the voltage difference ΔB between input terminals INB and INBb.

The variable level shifter 60 has the configuration shown in FIG. 4, or another configuration that operates in the same way. Input terminals InA, InAb, InB, and InBb of the variable level shifter 60 are coupled to input terminals INA, INAb, INB, and INBb of the multiplier. The differential voltages at output terminals OutP and OutPb of the variable level shifter 60, and at output terminals OutM and OutMb of the variable level shifter 60, are thus both proportional to the voltage difference ΔA at input terminals INA and INAb of the multiplier, and are shifted in opposite directions by an amount proportional to the voltage difference ΔB at input terminals INB and INBb of the multiplier.

Output terminals OutP and OutPb of the variable level shifter 60 are connected to a first pair of differential voltage input terminals InP and InPb of the multiplying circuit 61. Output terminals OutM and OutMb of the variable level shifter 60 are connected to a second pair of differential voltage input terminals InM and InMb of the multiplying circuit 61.

The multiplying circuit 61 comprises two constant-current sources ISm1 and ISm2, two NMOS transistors N61 and N62, both having their source terminals coupled to constant-current source ISm1, and two more NMOS transistors N63 and N64, both having their source terminals coupled to the other constant-current source ISm2.

Voltage input terminal InP of the multiplying circuit 61 is coupled to the gate of NMOS transistor N61. Voltage input terminal InPb is coupled to the gate of NMOS transistor N62. Transistors N61 and N62 operate as a differential amplifier responsive to the voltage difference between input terminals InP and InPb. Similarly, voltage input terminal InM is coupled to the gate of NMOS transistor N63, voltage input terminal InMb is coupled to the gate of NMOS transistor N64, and transistors N63 and N64 operate as a differential amplifier responsive to the voltage difference between input terminals InP and InPb.

The drain terminals of NMOS transistors N61 and N64 are both coupled to output terminal Outb and to one end of a load resistor RLb. The other end of load resistor RLb is coupled to a supply voltage (Vcc) node. Similarly, the drain terminals of NMOS transistors N62 and N63 are both coupled to output terminal Out and to one end of a load resistor RL, the other end of which is coupled to a Vcc node.

Next the operation of the multiplier will be described. The description will focus on the operation of the multiplying circuit 61, as the operation of the variable level shifter 60 has already been explained.

In the following description, $V_P$ denotes the potential of input terminal InP of the multiplying circuit 61, $V_{Pb}$ denotes the potential of input terminal InPb, $V_M$ denotes the potential of input terminal InM, and $V_{Mb}$ denotes the potential of input terminal InMb. $V_S$ denotes the source potential of NMOS transistors N61 to N64, and $V_T$ denotes their threshold voltage. It will be assumed that transistors N61 to N64 are saturated.

The current $I_{0b}$ flowing through load resistor RLb is the sum of the drain currents of NMOS transistors N61 and N64, and can be expressed by equation (2, 1), in which K is a constant. The current $I_0$ flowing through load resistor RL is the sum of the drain currents of NMOS transistors N62 and N63, and can be expressed by equation (2, 2), in which K is the same constant.

$$I_{0b}=K(V_P-V_S-V_T)^2+K(V_{Mb}-V_S-V_T)^2 \quad (2, 1)$$

$$I_0=K(V_{Pb}-V_S-V_T)^2+K(V_M-V_S-V_T)^2 \quad (2, 2)$$

As noted earlier, the constants $k_0$ and $k_1$ that appeared in equations (1, 15) and (1, 16) can be made equal. In the following description it will be assumed that these constants are equal, and both will be represented by the letter k. From equations (1, 15) and (1, 16)], and from the description of the second variable level shifter, it can be seen that the potentials $V_P$, $V_{Pb}$, $V_M$, and $V_{Mb}$ of input terminals InP, InPb, InM, and InMb of the multiplying circuit 61 (which are the potentials of output terminals OutP, OutPb, OutM, and OutMb of the variable level shifter 60) can be expressed by equations (2, 3), (2, 4), (2, 5), and (2, 6).

$$V_P=V_0+k\Delta V_A+k\Delta V_B \quad (2, 3)$$

$$V_{Pb}=V_0-k\Delta V_A+k\Delta V_B \quad (2, 4)$$

$$V_M=V_0+k\Delta V_A-k\Delta V_B \quad (2, 5)$$

$$V_{Mb}=V_0-k\Delta V_A-k\Delta V_B \quad (2, 6)$$

Quantities $V_X$, α, and β can be defined as in equations (2, 7), (2, 8), and (2, 9). Note that the α defined by equation (2, 8) is unrelated to the α that appeared in equations (1, 3) to (1, 14).

$$V_X=V_0-V_S-V_T \quad (2, 7)$$

$$\alpha=k\Delta V_B+V_X \quad (2, 8)$$

$$\beta=-k\Delta V_B+V_X \quad (2, 9)$$

If equations (2, 3) to (2, 9) are substituted into equations (2, 1) and (2, 2), the currents $I_0$ and $I_{0b}$ can be reduced to the form given in equations (2, 10) and (2, 11).

$$I_0=K(k\Delta V_A+\alpha)^2+K(-k\Delta V_A+\beta)^2 \quad (2, 10)$$

$$I_{0b}=K(-k\Delta V_A+\alpha)^2+K(k\Delta V_A+\beta)^2 \quad (2, 11)$$

The difference $I_0-I_{0b}$, denoted Iout, between the currents flowing through load resistors R1 and RLb then reduces to the form given by equation (2, 12), the nonlinear effects of transistors N61 to N64 unexpectedly canceling out. If equations (2, 8) and (2, 9) are substituted into equation (2, 12), the current difference reduces further to the form in equation (2, 13), in which K' is equal to $4k^2K$.

$$Iout=K(2K\alpha\Delta V_A-2k\beta\Delta V_A) \quad (2, 12)$$

$$Iout=K'\Delta V_A\Delta V_B \quad (2, 13)$$

Thus the differential output current Iout ($I_0-I_{0b}$) is proportional to the product of the differential input voltages $\Delta V_A$ and $\Delta V_B$. The voltage difference between output terminals Out and Outb is equal to this current difference multiplied by the resistance value of resistors RL and RLb, and is therefore also proportional to the product of $\Delta V_A$ and $\Delta V_B$.

The cross-coupling of the drains of the two pairs of NMOS transistors in the multiplying circuit 61 thus produces a multiplying characteristic with excellent linearity. In addition, both the variable level shifter 60 and the multiplying circuit 61 have symmetric circuit connections with respect to their input terminals. Input terminals INA, INAb, INB, and INBb of the differential multiplier therefore have the same bias conditions, and the same gain and frequency responses. Moreover, both the variable level shifter 60 and the multiplying circuit 61 have only two cascaded transistor stages, including the current sources, so there is less voltage drop than in the conventional multiplier described earlier, which is an advantage in low-voltage operation.

The novel variable level shifters and multiplier described above are useful in various applications. To give just two of many examples, the symmetry of the input and output characteristics of these circuits recommends their use in the high-precision differential phase detectors employed in phase-locked loops (PLLs), and the capability of these circuits to operate with low supply voltages makes them useful as components of modulating and demodulating circuits in portable telecommunication equipment.

Variations

The equations above have described transconductor cells with perfectly linear input-output characteristics, in which differential output current is strictly proportional to differential input voltage. This is preferable, but of course the invention remains useful if the correspondence between differential output current and differential input voltage is one of only substantial proportionality.

Wang transconductors containing level shifters of the source-follower type can be employed in place of the transconductor cells shown in FIGS. 1 and 4. This replacement may further improve the linearity of the input-output characteristics. The level shifters in Wang transconductor cells need only perform a constant level shift, not dependent on an input voltage signal, so the variable range of their output need not be large, and conventional level shifters of the source-follower type shown in FIG. 6 can be employed without impairment of the advantages of the invented circuits in low-voltage operation.

If the two constant-current sources ISm1 and ISm2 in the multiplying circuit 61 have the same current capability, they can be replaced by a single common constant-current source.

The invented multiplier can employ two variable level shifters of the type shown in FIG. 1, instead of one variable level shifter of the type shown in FIG. 4. Any other type of variable level shifter or combination of variable level shifters having the same input-output characteristics as the variable level shifter in FIG. 4 can also be used.

Figure 5:
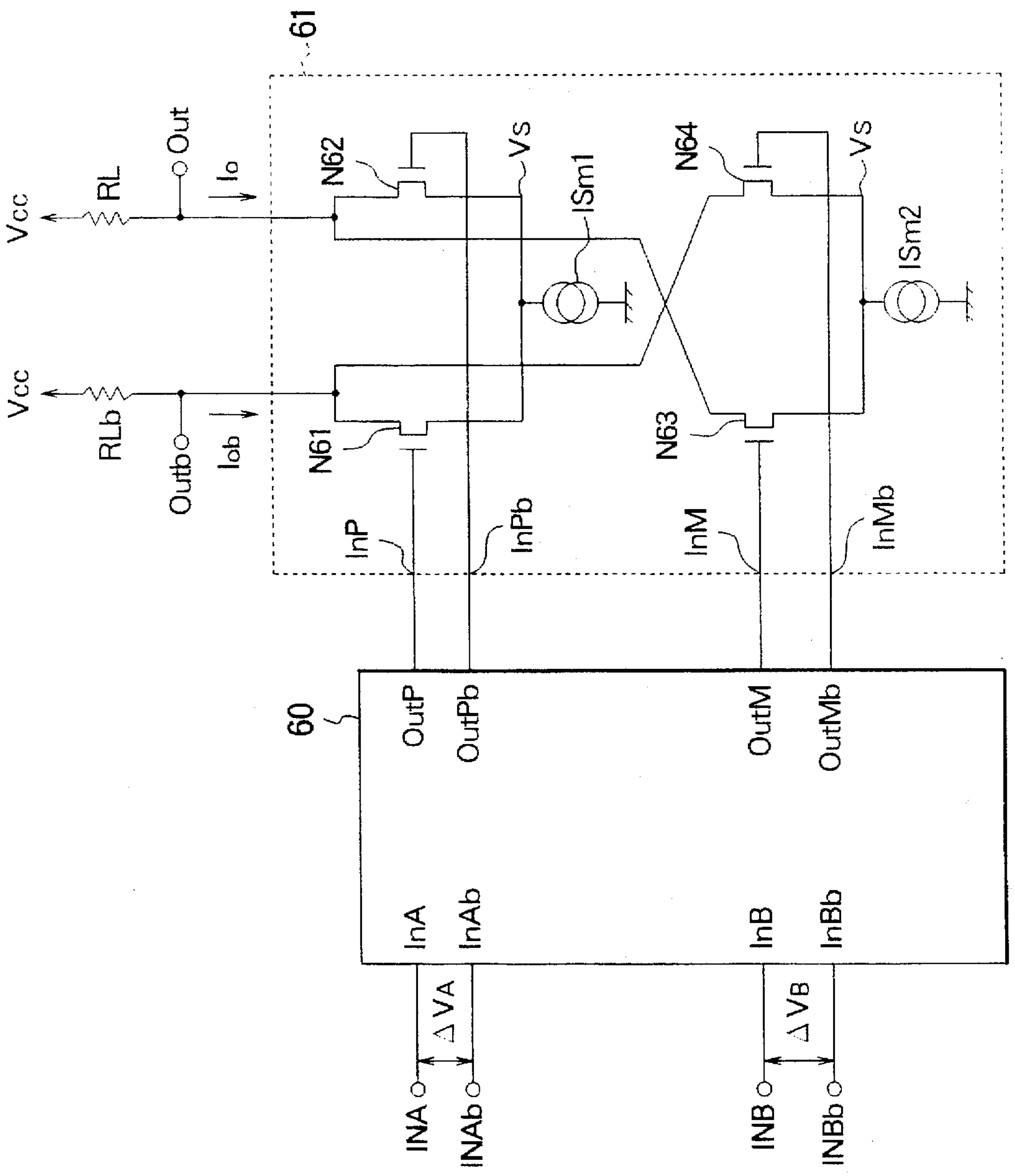
FIG. 5 is a circuit diagram illustrating a novel differential multiplier.

Current-sensing amplifiers can be inserted between the load resistors and the output terminals of the transconductor cells in the variable level shifters in FIGS. 1, 4, or between the load resistors and the multiplying circuit 61 in FIG. 5, to obtain amplified output signals.

If single-ended instead of differential operation is required, one input terminal in each pair of differential input terminals can be set to a constant reference level.

The invention is not restricted to the use of NMOS transistors. Other types of field-effect transistors having similar characteristics, such as PMOS transistors, metal-semiconductor (MES) transistors, metal-insulator-semiconductor (MIS) transistors, or metal-nitride-oxide-semiconductor (MNOS) transistors, can be employed instead.

Those skilled in the art will recognize that further modifications are possible within the scope of the invention as claimed below.

What is claimed is:

1. A variable level shifter, comprising:

a first pair of input terminals for receiving a first pair of voltage signals having a first voltage difference;

a second pair of input terminals for receiving a second pair of voltage signals having a second voltage difference;

a first output terminal;

a second output terminal;

a first load element having one end and an other end, the one end of the first load element coupled to a supply voltage node supplied with a first potential, the other end of the first load element coupled to the second output terminal;

a second load element having one end and an other end, the one end of the second load element coupled to a supply voltage node supplied with the first potential, the other end of the second load element coupled to the first output terminal;

a first transconductor cell having a first transistor and a second transistor, each of which has a first electrode, a second electrode and a control electrode, the control electrode of the first transistor coupled to one of the first pair of input terminals, the control electrode of the second transistor coupled to the other of the first pair of input terminals, the first electrodes of the first and second transistors coupled to a first current source, the second electrode of the first transistor coupled to the other end of the first load element, the second electrode of the second transistor coupled to the other end of the second load element;

a second transconductor cell having a third transistor and a fourth transistor, each of which has a first electrode, a second electrode and a control electrode, the control electrode of the third transistor coupled to one of the second pair of input terminals, the control electrode of the fourth transistor coupled to the other of the second pair of input terminals, the first electrodes of the third and fourth transistors coupled to a second current source, the second electrode of the third transistor coupled to the other end of the second load element, the second electrode of the fourth transistor coupled to a supply voltage node supplied with the first potential; and a third transconductor cell having a fifth transistor and a sixth transistor, each of which has a first electrode, a second electrode and a control electrode, the control electrode of the fifth transistor coupled to the one of the second pair of input terminals, the control electrode of the sixth transistor coupled to the other of the second pair of input terminals, the first electrodes of the fifth and sixth transistors coupled to a third current source, the second electrode of the fifth transistor coupled to the other end of the first load element, the second electrode of the sixth transistor coupled to a supply voltage node supplied with the first potential.

2. The variable level shifter of claim 1, wherein each of said first and second load elements is a resistor.

3. The variable level shifter of claim 1, wherein:

said first transconductor cell includes said first current source, which is a constant-current source;

said second transconductor cell includes said second current source, which is a constant-current source; and said third transconductor cell includes said third current source, which is a constant-current source.

4. A variable level shifter, comprising:

a first pair of input terminals for receiving a first pair of voltage signals having a first voltage difference;

a second pair of input terminals for receiving a second pair of voltage signals having a second voltage difference;

a first output terminal;

a second output terminal;

a third output terminal;

a fourth output terminal;

a first load element having one end and an other end, the one end of the first load element coupled to a supply voltage node supplied with a first potential, the other end of the first load element coupled to the first output terminal;

a second load element having one end and an other end, the one end of the second load element coupled to a supply voltage node supplied with the first potential, the other end of the second load element coupled to the second output terminal;

a third load element having one end and an other end, the one end of the third load element coupled to a supply voltage node supplied with the first potential, the other end of the third load element coupled to the fourth output terminal;

a fourth load element having one end and an other end, the one end of the fourth load element coupled to a supply voltage node supplied with the first potential, the other end of the fourth load element coupled to the third output terminal;

a first transconductor cell having a first transistor and a second transistor, each of which has a first electrode, a second electrode and a control electrode, the control electrode of the first transistor coupled to one of the first pair of input terminals, the control electrode of the second transistor coupled to the other of the first pair of input terminals, the first electrodes of the first and second transistors coupled to a first current source, the second electrode of the first transistor coupled to the other end of the second load element, the second electrode of the second transistor coupled to the other end of the first load element;

a second transconductor cell having a third transistor and a fourth transistor, each of which has a first electrode, a second electrode and a control electrode, the control electrode of the third transistor coupled to one of the second pair of input terminals, the control electrode of the fourth transistor coupled to the other of the second pair of input terminals, the first electrodes of the third and fourth transistors coupled to a second current source, the second electrode of the third transistor coupled to the other end of the second load element, the second electrode of the fourth transistor coupled to the other end of the fourth load element;

a third transconductor cell having a fifth transistor and a sixth transistor, each of which has a first electrode, a second electrode and a control electrode, the control electrode of the fifth transistor coupled to the one of the second pair of input terminals, the control electrode of the sixth transistor coupled to the other of the second pair of input terminals, the first electrodes of the fifth and sixth transistors coupled to a third current source, the second electrode of the fifth transistor coupled to the other end of the first load element, the second electrode of the sixth transistor coupled to the other end of the third load element; and a fourth transconductor cell having a seventh transistor and an eighth transistor, each of which has a first electrode, a second electrode and a control electrode, the control electrode of the seventh transistor coupled to the one of the first pair of input terminals, the control electrode of the eighth transistor coupled to the other of the first pair of input terminals, the first electrodes of the seventh and eighth transistors coupled to a fourth current source, the second electrode of the seventh transistor coupled to the other end of the third load element, the second electrode of the eighth transistor coupled to the other end of the fourth load element.

5. The variable level shifter of claim 4, wherein each of said first, second, third and fourth load elements is a resistor.

6. The variable level shifter of claim 4, wherein said first transconductor cell includes said first current source, which is a constant-current source;

said second transconductor cell includes said second current source, which is a constant-current source; and said third transconductor cell includes said third current source, which is a constant-current source.

* * * * *